US011821077B2

(12) United States Patent
Solomon et al.

(10) Patent No.: US 11,821,077 B2
(45) Date of Patent: Nov. 21, 2023

(54) SPUTTERING TARGET

(71) Applicant: Youngstown State University, Youngstown, OH (US)

(72) Inventors: Constantin Virgil Solomon, Youngstown, OH (US); Christopher Yaw Bansah, Youngstown, OH (US); Tom Nelson Oder, Youngstown, OH (US)

(73) Assignee: YOUNGSTOWN STATE UNIVERSITY, Youngstown, OH (US)

( * ) Notice: Subject to any disclaimer, the term of this patent is extended or adjusted under 35 U.S.C. 154(b) by 73 days.

(21) Appl. No.: 17/125,175

(22) Filed: Dec. 17, 2020

(65) Prior Publication Data
US 2022/0195584 A1     Jun. 23, 2022

(51) Int. Cl.
*C23C 14/34*     (2006.01)
*B33Y 80/00*     (2015.01)

(52) U.S. Cl.
CPC .......... *C23C 14/3414* (2013.01); *B33Y 80/00* (2014.12)

(58) Field of Classification Search
CPC ............................. C23C 14/3414; B33Y 80/00
See application file for complete search history.

(56) References Cited

U.S. PATENT DOCUMENTS

| 4,135,286 | A | * | 1/1979 | Wright | ...................... B22F 5/10 204/192.15 |
| 6,500,321 | B1 | | 12/2002 | Ashtiani et al. | |
| 2018/0127866 | A1 | | 5/2018 | Irumata et al. | |

OTHER PUBLICATIONS

J. Musil, "Rectangular magnetron with full target erosion," *J. Vac. Sci. Technol. Vac. Surf. Films*, vol. 17, No. 2, pp. 555-563, Mar. 1999, doi: 10.1116/1.581618.
M. Wright and T. Beardow, "Design advances and applications of the rotatable cylindrical magnetron," *J. Vac. Sci. Technol. Vac. Surf. Films*, vol. 4, No. 3, pp. 388-392, May 1986, doi: 10.1116/1.573888.
G. Bräuer, B. Szyszka, M. Vergöhl, and R. Bandorf, "Magnetron sputtering—Milestones of 30 years," *Vacuum*, vol. 84, No. 12, pp. 1354-1359, Jun. 2010, doi: 10.1016/j.vacuum.2009.12.014.
T. Ide, A. Hossain, Y. Nakamura, and Y. Ohtsu, "Rotational cross-shaped magnetized radio-frequency sputtering plasma source for uniform circular target utilization," *J. Vac. Sci. Technol. Vac. Surf. Films*, vol. 35, p. 061312, Nov. 2017, doi: 10.1116/1.4999221.
Y. Ohtsu, T. Nakashima, R. Tanaka, and J. Schulze, "Characteristics of a rotational windmill-shaped radio frequency magnetron sputtering plasma for effective target utilization," *Vacuum*, vol. 181, p. 109593, Nov. 2020, doi: 10.1016/j.vacuum.2020.109593.

(Continued)

*Primary Examiner* — Rick K Chang
(74) *Attorney, Agent, or Firm* — Lippes Mathias LLP

(57) ABSTRACT

A sputtering target having a unitary body. The unitary body includes a planar substrate plate and a toroidal portion extending from a top surface of the substrate plate. The toroidal portion reduces non-uniform erosion against the plate caused by a magnetic field applied to the target. In use, the magnetic field is initially received at the toroidal portion. After the magnetic field wears down the toroidal portion, the magnetic field is received at the substrate plate.

1 Claim, 6 Drawing Sheets

(56) References Cited

OTHER PUBLICATIONS

P. MacKay, S. Wakeham, M. Wilde, J. Dutson, and J. Allen, "Laser damage threshold results for sputtered coatings produced using different deposition technologies," in Laser-Induced Damage in Optical Materials: 2011, Nov. 2011, vol. 8190, p. 819006, doi: 10.1117/12.899118.

F. Lofaj, L. Kvetková, P. Hviščová, M. Gregor, and M. Ferdinandy, "Reactive processes in the high target utilization sputtering (HiTUS) W-C based coatings," J. Eur. Ceram. Soc., vol. 36, No. 12, pp. 3029-3040, Sep. 2016, doi: 10.1016/j.jeurceramsoc.2015.12.043.

T. Takahashi, T. Hata, and M. Naoe, "Deposition of Co—Cr films by magnetron sputtering with highly efficient target utilization," IEEE Trans. Magn., vol. 26, No. 1, pp. 112-114, Jan. 1990, doi: 10.1109/20.50506.

M.P. Caputo, C.V. Solomon, A facile method for producing porous parts with complex geometries from ferromagnetic Ni—Mn—Ga shape memory alloys, Materials Letters, vol. 200, 2017, pp. 87-89, ISSN 0167-577X, https://doi.org/10.1016/j.matlet.2017.04.112.

\* cited by examiner

SPUTTERING TARGET

BACKGROUND

The present exemplary embodiment relates to a sputtering target and, more specifically, to a sputtering target having a configuration that reduces non-uniform wear and erosion at the target surface. It finds particular application in conjunction with magnetron sputtering and will be described with particular reference thereto. However, it is to be appreciated that the present exemplary embodiment is also amenable to other like applications.

Sputtering, also referred to as "sputter coating" is a process in which thin films are deposited from a solid sputtering target onto a substrate, generally using a sputtering device. The target provides the material that is used to deposit the film on the substrate. Sputtering is used to apply coatings on numerous products including those in the electronics (e.g., semiconductors), optoelectronics, energy (e.g., solar cells), and optical coatings sectors, among others.

FIG. 1 shows a conventional disc type target 100 known in the PRIOR ART. The conventional target 100 is illustrated as a round, generally planar disc formed from the material to be sputtered. Sputtering devices are sensitive to the shape of a target, which imposes a boundary condition upon an electric field during sputtering.

FIG. 2 shows a magnetron sputtering operation known in the PRIOR ART. In the example, the sputtering device 200 includes a vacuum chamber that receives the electric field in the presence of an inert gas 202, which is shown as argon for illustrative purposes. The target 204 forms part of a cathode assembly 206 in an evacuated chamber containing the gas 202. When the electric or magnetic field is applied between the cathode assembly 206 and an anode in the chamber, the gas atoms 202 are ionized via their collision with electrons 210 accelerated away from the surface of the cathode 208. The electric field accelerates the ionized gas atoms 202 toward the target 204. The target 204 is subjected to bombardment by the high energy ions to dislodge and eject material 214 from the target 204. Once free from the target 204, the dislodged material particles 214 redeposit upon the substrate 216 as a thin film.

One problem with the conventional approach is that the magnetic field 212 causes the particles 214 to dislodge from the target 204 in a non-uniform pattern. FIG. 3 is a sputtering target 300 from FIG. 1 at the end of its useful life—that is, after undergoing the sputtering operation. As illustrated in FIG. 3, the magnetic field creates a racetrack effect 302 or depression where the target material eroded. That is, the target material dislodged faster under heavy electric field than at other areas of the disc. A consequence of this uneven wearing is that only approximately thirty percent (30%) of the sputtering material is consumed when the target reaches the end of its useful life. This leads to waste of usually very high-purity and expensive target materials.

Additional approaches were introduced to obtain a more uniform magnetic field at the target or to reduce waste of target material. Sputtering devices that employ helical magnets or yoke magnets, for example, can use up to 90% of the target material. Other methods refill the eroded racetrack portion with more material to allow the target to be reused. However, a sputtering target is desired which controls the target erosion to maximizes target material utilization without requiring adjustments be made to the sputtering device or additional steps be taken on the target.

INCORPORATION BY REFERENCE

The disclosure of "A facile method for producing porous parts with complex geometries from ferromagnetic Ni—Mn—Ga shape memory alloys", by M. P. Caputo et al. in Materials Letters, Aug. 1, 2017 is incorporated herein by reference.

BRIEF DESCRIPTION

A first embodiment of the disclosure is directed to a sputtering target. The sputtering target has a planar substrate plate and a toroidal portion extending from a top surface of the substrate plate. The toroidal portion reduces non-uniform erosion against the plate caused by a magnetic field during the sputtering process.

In another embodiment of the disclosure, a sputtering target includes a toroidal body portion operative to receive a magnetic field during a sputtering operation. The toroidal body portion reduces waste of target material during the sputtering operation.

In an additional embodiment, a method for sputtering a target is disclosed. The sputtering target has a toroidal portion extending from a substrate plate. In the method, a magnetic field is initially received at the toroidal portion. The toroidal portion reduces non-uniform erosion against the plate. After wearing down the toroidal portion by bombardment, the magnetic field is received at the substrate plate.

BRIEF DESCRIPTION OF THE DRAWINGS

The foregoing and other features of the present disclosure will become apparent to those skilled in the art to which the present disclosure relates upon reading the following description with reference to the accompanying drawings, in which.

DETAILED DESCRIPTION

The present disclosure relates to a sputtering target and, more specifically, to a sputtering target having a configuration that reduces material waste caused by non-uniform wear and erosion at a conventional target surface. As used herein, "sputtering" refers to a physical vapor deposition process used to apply a very thin functional coating on a substrate.

Figure 1:
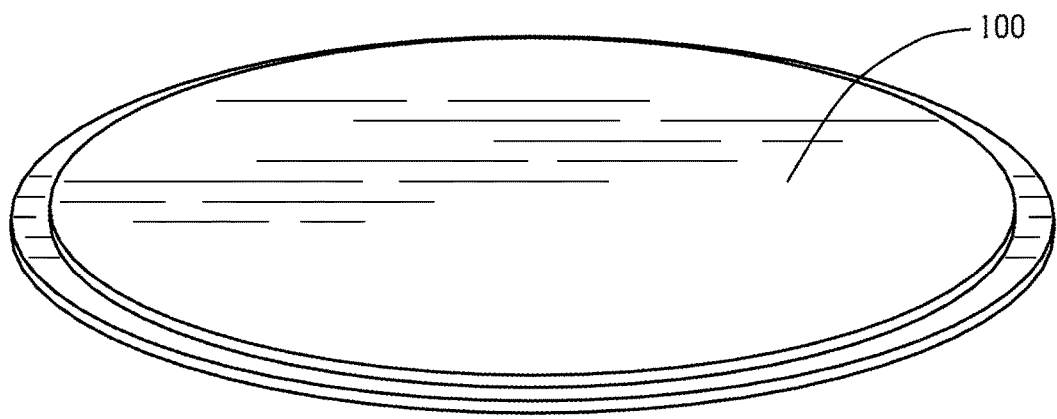
FIG. 1 is a sputtering target in the PRIOR ART before undergoing a sputtering operation.
Figure 2:
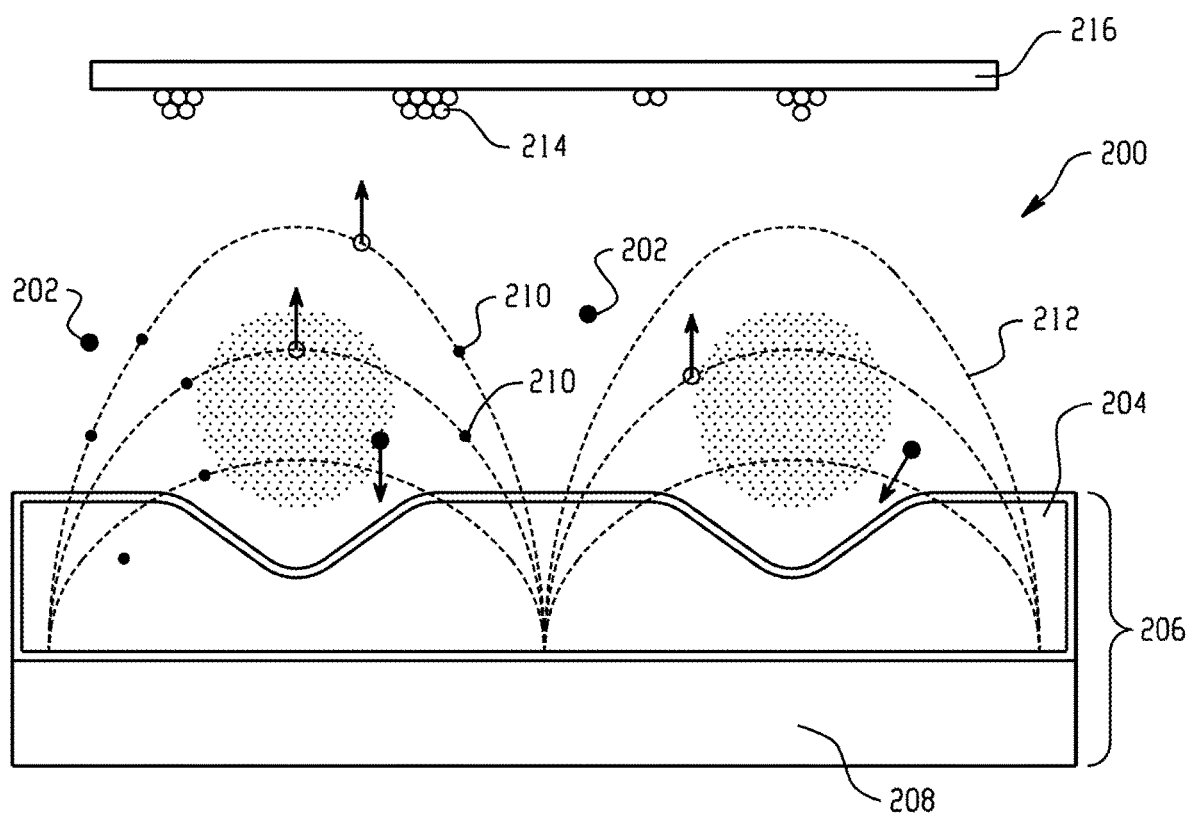
FIG. 2 illustrates a sputtering operation performed in the PRIOR ART.
Figure 3:
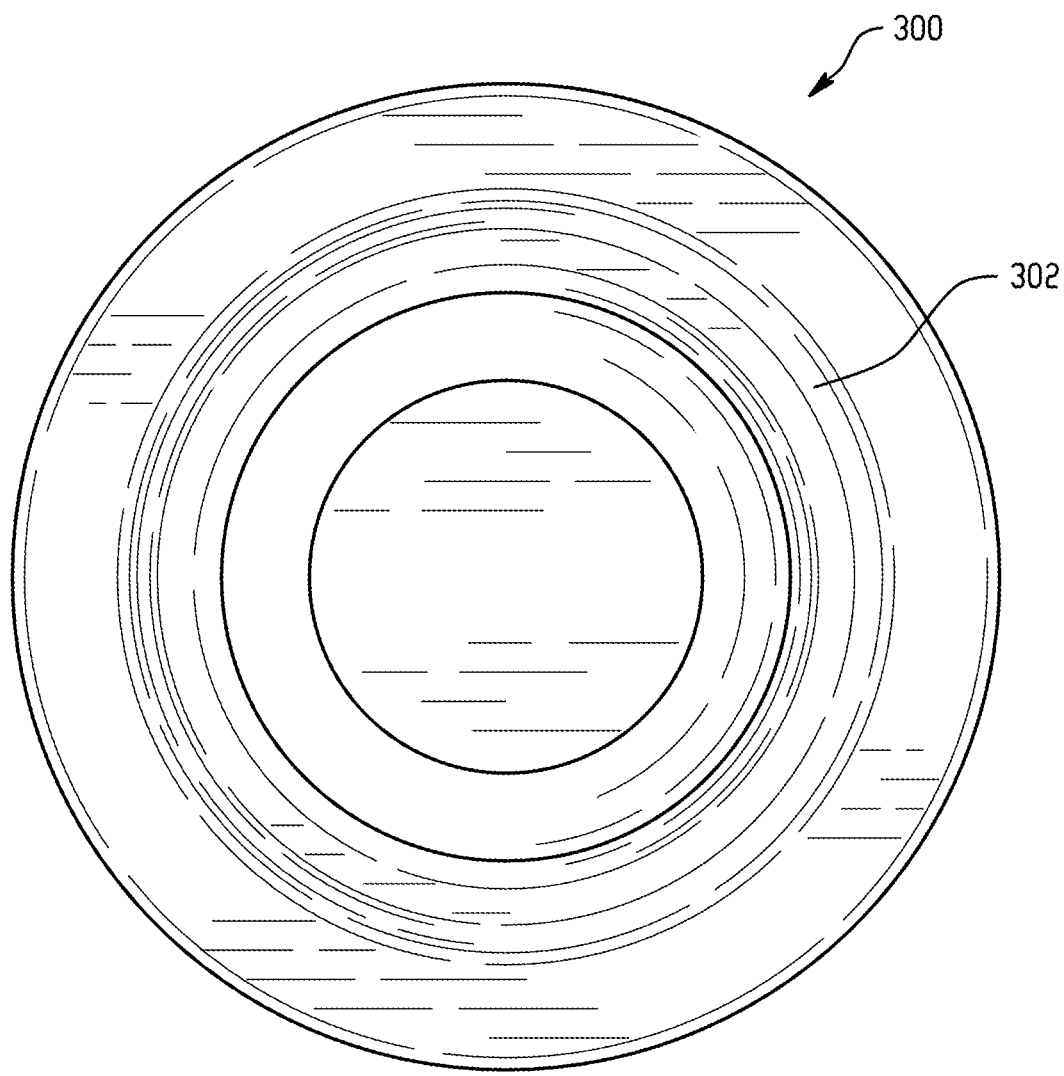
FIG. 3 is a sputtering target in the PRIOR ART after undergoing the sputtering operation.
Figure 4:
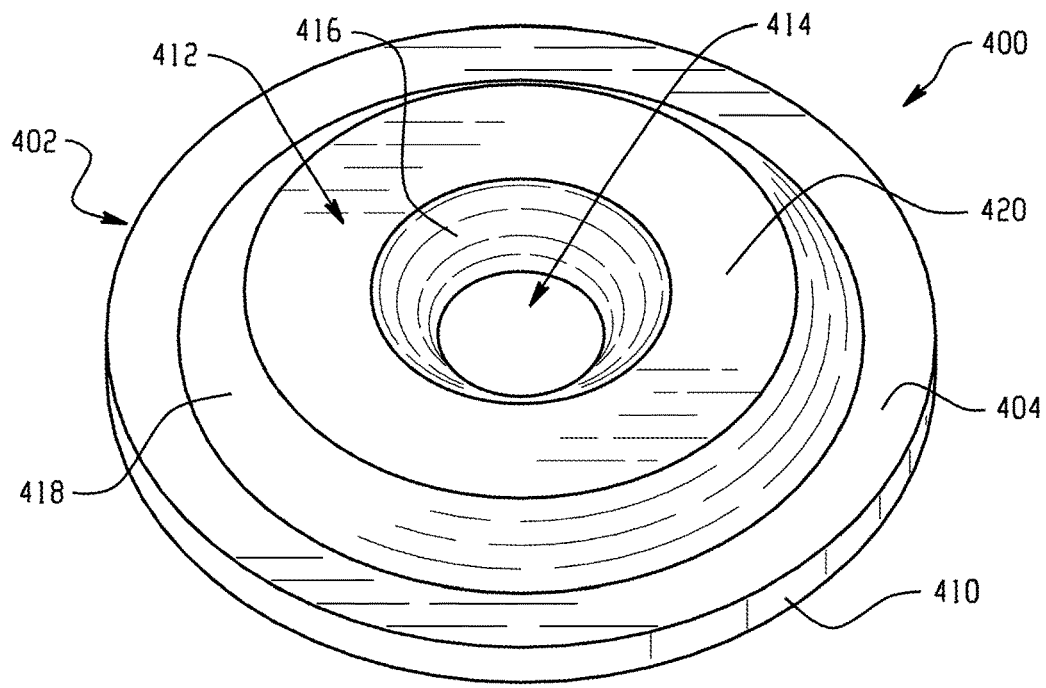
FIGS. 4-7 show a first embodiment of the sputtering target according to the disclosure.
Figure 5:
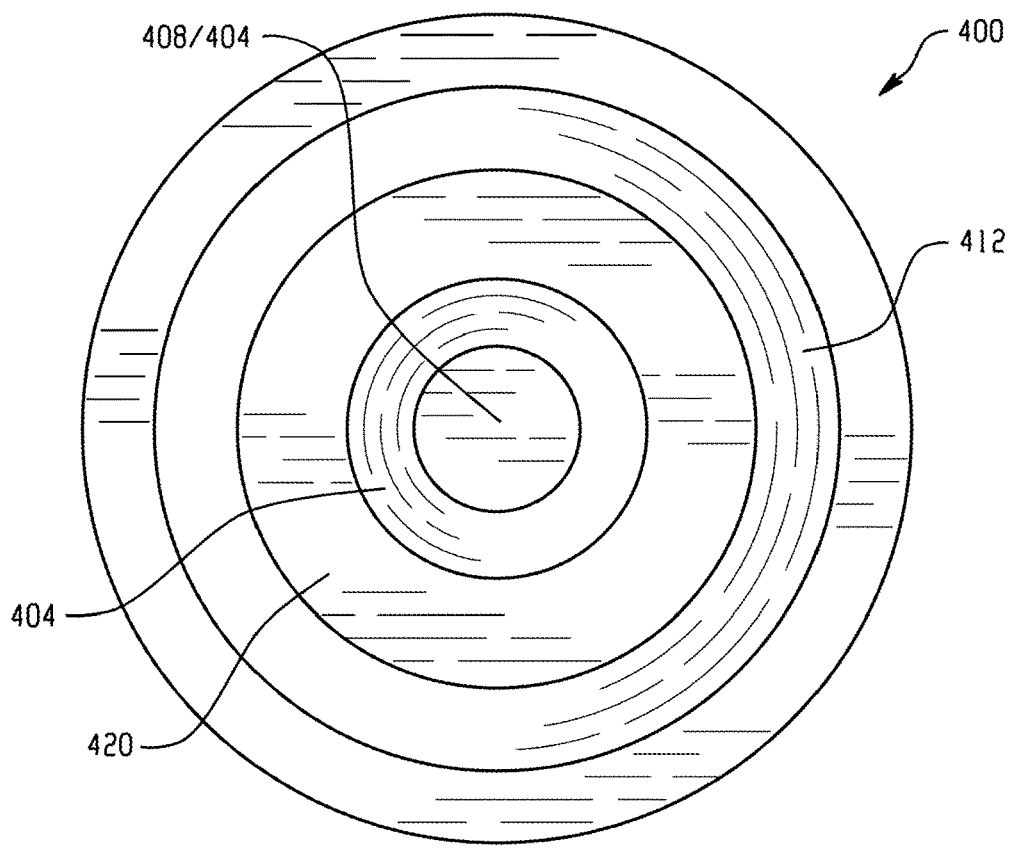
Figure 6:
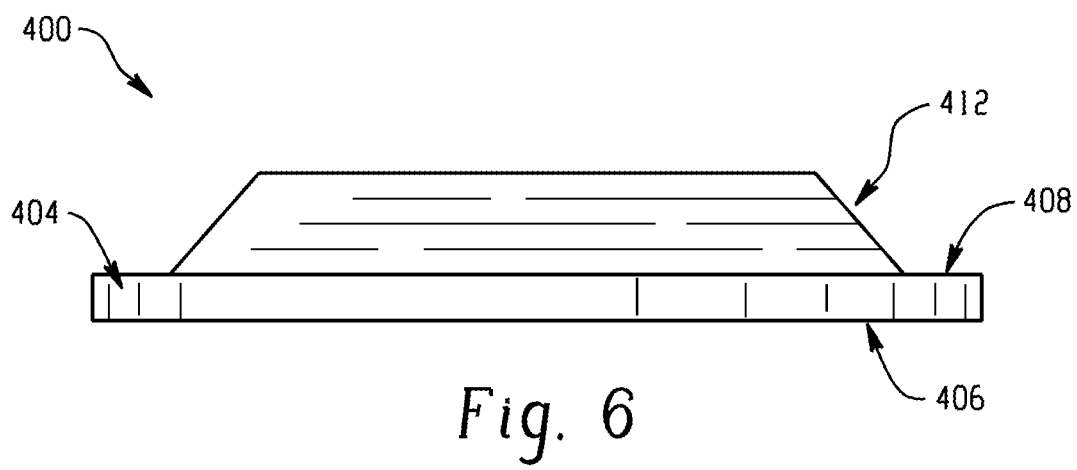
Figure 7:
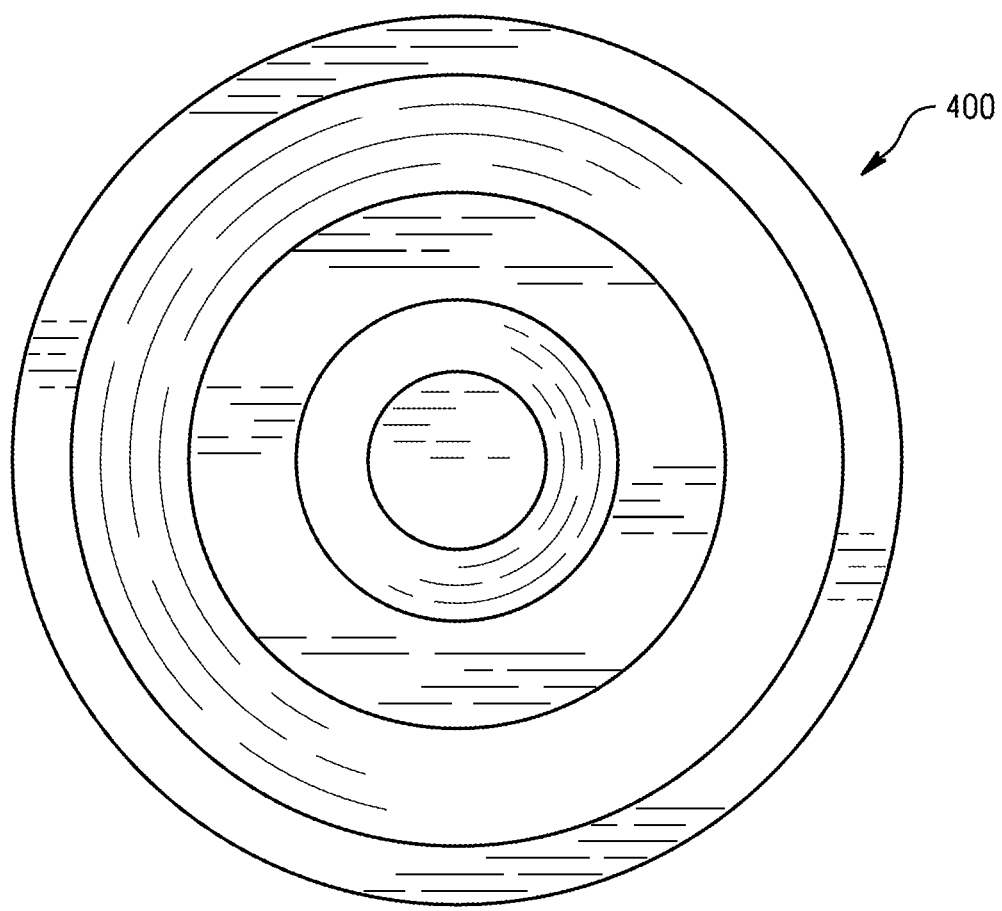
Figure 8:
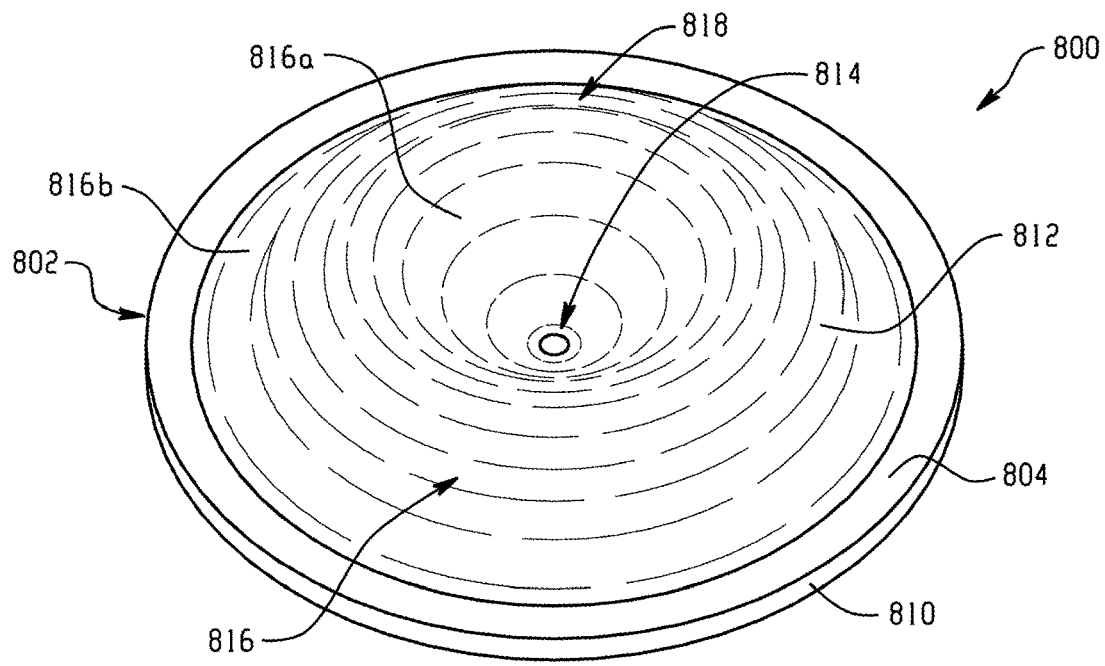
FIGS. 8-11 show a second embodiment of the sputtering target according to the disclosure.
Figure 9:
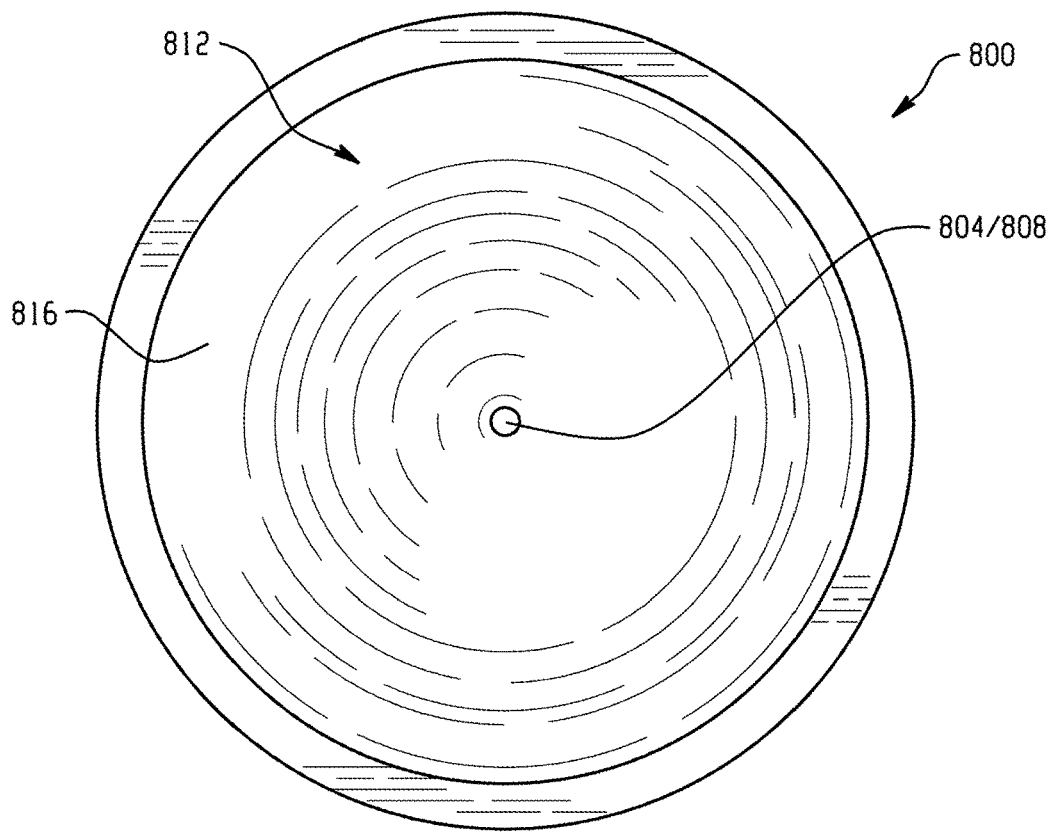
Figure 10:
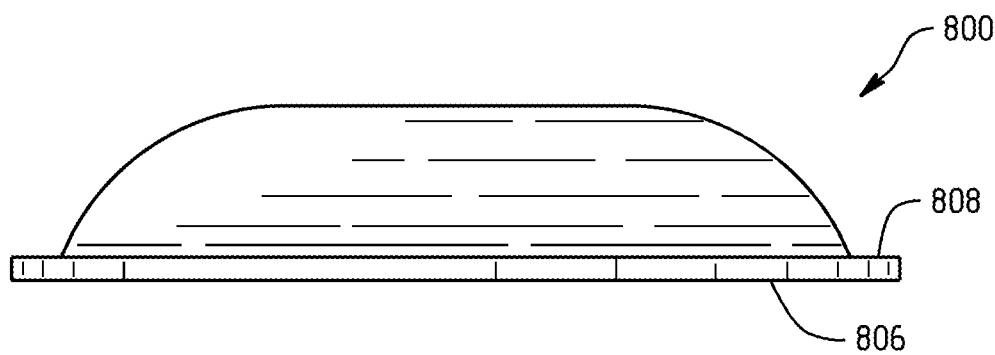
Figure 11:
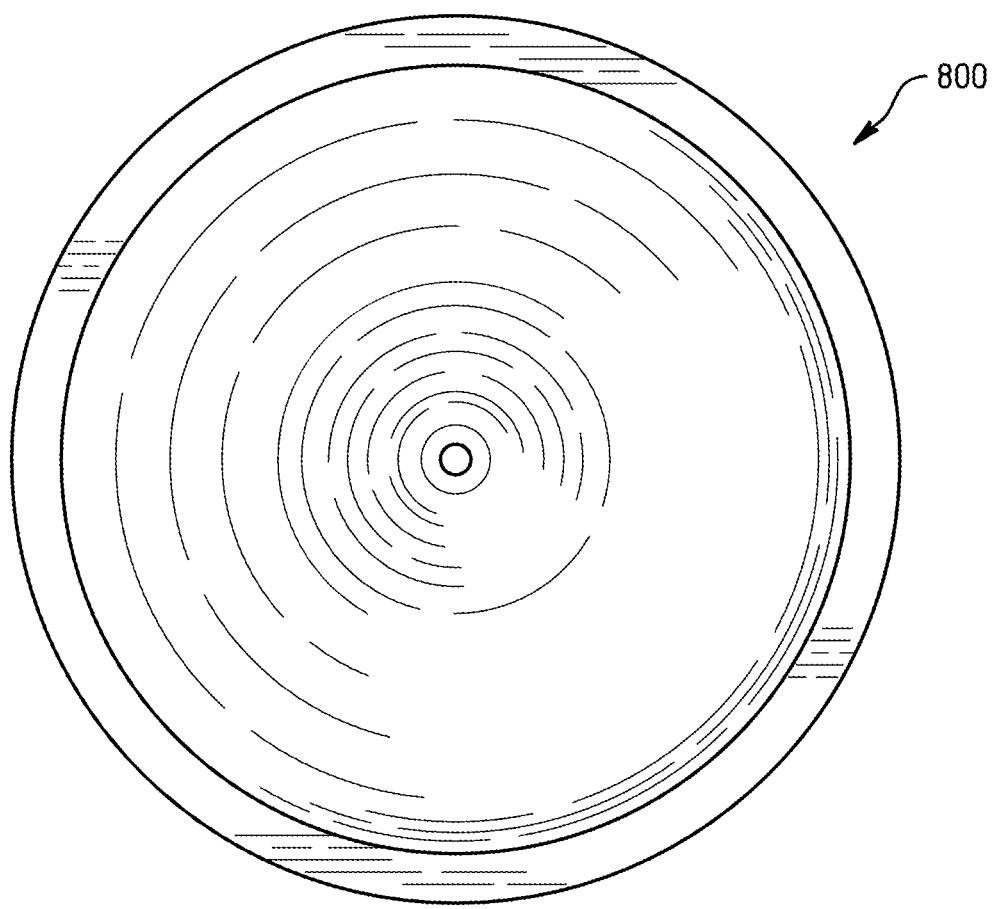

With reference to FIGS. 4-7, one embodiment of a sputtering target 400 is shown according to the present disclosure. The sputtering target 400 is formed from a unitary body 402. The body 402 includes a planar substrate plate 404 having a bottom side 406 and a side opposite the bottom side, hereinafter referred to as the "top side 408". The bottom side 406 is operable to sit on a cathode (208 in FIG. 2) in a sputtering device. The plate 404 includes at least one edge 410 defining the boundaries of the plate 404. In one embodiment, the plate is approximately 1-2 inches in diameter and, more approximately, 1-½ inch in diameter. The plate 404 is continuous between the at least one edge 410. In the illustrative embodiment, the plate 404 is round and has the substantial shape of a circle or disk, although there is no limitation made herein to the shape of the plate. The plate 404 can have a circular, square or elongate profile; symmetric or unsymmetric profile along at least one axis; and smooth or sharp corners and edges, among other features.

Returning to FIG. 4, the illustrated body 402 includes a toroidal portion 412 extending from the top side 408 of the plate 404. The target 400 further includes a tube 414 along a central axis of the toroidal portion 412. More specifically, a sidewall 416 of the toroidal portion defines the tube 414. The sidewall 416 (hereinafter the "inner sidewall 416") extends upward from the plate 404 at the inner diameter of the toroidal portion 412. An outer sidewall 418 extends upward from the plate 404 at the outer diameter of the toroidal portion 412. The inner sidewall 416 can be situated perpendicular to the plate 404 or it can meet the plate at an angle. In the illustrated embodiment, the inner sidewall 416 is oriented to allow the tube 414 to taper toward the plate 404. For a tapered profile, the inner diameter of the toroidal portion 412 is dynamic along the longitudinal extent or axis of the tube 414. There is no limitation to the length of the inner diameter of the toroidal portion 412 at the point where the toroidal portion meets (or intersects with) the plate 404. In other words, there is no limitation herein to the amount of the top side 408 of the plate exposed where the toroidal portion 412 meets the plate 404.

The sputtering target shown in FIGS. 4-7 is defined by at least two connecting sidewall portions including the inner sidewall 416, the outer sidewall 418, and a top sidewall 420 connecting the inner and outer sidewalls. There is no limitation made herein to the number or features of each sidewall portion 416-420 forming the toroid 412. The toroidal portion 412 in FIG. 4 includes the top sidewall 420, which is generally parallel to the plate 412. However, other embodiments are contemplated that are absent a top sidewall; have a rounded or curvilinear side walls; and/or have one or more sidewalls or sidewall portions that are rounded or curvilinear; etc.

Continuing with FIGS. 4-7, the sputtering target 400 shows the toroidal portion 412 being removed a distance from the edge 410 of the plate 404. However, other embodiments are contemplated in which the toroidal portion 412 is immediately positioned along the edge 410 of the plate 404. There is further no limitation made herein to the height of the toroidal portion 412 relative to the height of the plate 404. In the illustrated embodiment, the height of the toroidal portion 412 is greater than the height of the plate 404. The specific profile of the toroidal portion 412 is selected to receive the heaviest bombardment by the high energy ions at the sputtering target 400. In this manner, the inner and outer diameters of the toroidal portion 412 may be selected based on known properties of the magnetic field, gas, and target material employed in the sputtering device. The toroidal portion 412 is operable to allow for uniform erosion of the sputtering target toward the plate, increasing the life of the target, and decreasing waste material. In this manner, the sputtering target is capable of greater than 95% consumption during its useful life.

Turning to FIGS. 8-11, another embodiment of a sputtering target 800 is shown according to the present disclosure. The sputtering target 800 is formed from a unitary body 802. The body 802 includes a planar substrate plate 804 having a bottom side 806 and a side opposite the bottom side, hereinafter referred to as the "top side 808". The bottom side 806 is operable to sit on a cathode (208 in FIG. 2) in a sputtering device. The plate 804 includes at least one edge 810 defining the boundaries of the plate 804. The plate 804 is continuous between the at least one edge 810. In the illustrative embodiment, the plate 804 is round and has the substantial shape of a circle or disk, although there is no limitation made herein to the shape of the plate. The plate 804 can have a circular, square or elongate profile; be symmetric or unsymmetric along at least one axis; and have smooth or sharp corners and edges, among other features.

Returning to FIG. 8, the illustrated body 802 includes a toroidal portion 812 extending from the top side 808 of the plate 804. The target 800 further includes a tube 814 along a central axis of the toroidal portion 412. More specifically, a sidewall 816 of the toroid 812 defines the tube 814. In the illustrated embodiment, the sidewall 816 extends upward from the plate 804 at the outer diameter of the toroidal portion 812 and terminates at the plate at the inner diameter of the toroidal portion. The sidewall 816 is smooth and continuous. The sidewall 816 includes an inner sidewall portion 816a, which extends upward from the plate 804 at the inner diameter of the toroidal portion 412. The sidewall 816 also includes an outer sidewall portion 816b, which extends upward from the plate 804 at the outer diameter of the toroidal portion 812. The outer sidewall portion 816b transitions to the inner sidewall portion 816a at a crest 818 of the toroid 812.

The inner and/or outer sidewall portions 816a-b can be situated perpendicular to the plate 804 or they can meet the plate at an angle. In the illustrated embodiment, the inner sidewall portion 816a is oriented to allow the tube 814 to taper toward the plate 804. For a tapered profile, the inner diameter of the toroidal portion 812 is dynamic along the longitudinal extent or axis of the tube 814. There is no limitation to the length of the inner diameter of the toroidal portion 812 at the point where the toroidal portion meets (or intersects with) the plate 804. In other words, there is no limitation herein to the amount of the top side 808 of the plate 804 exposed where the toroidal portion 812 meets the plate.

Continuing with FIGS. 8-11, the sputtering target 800 shows the toroidal portion 812 being removed a distance from an edge 810 of the plate 804. However, other embodiments are contemplated in which the toroidal portion 812 is immediately positioned along the edge 810 of the plate 804. There is further no limitation made herein to the height of the toroidal portion 812 relative to the height of the plate 804. In the illustrated embodiment, the height of the toroidal portion 812 is greater than the height of the plate 804, but they can be equal heights or the toroidal portion can have less height. The specific profile of the toroidal portion 812 is selected to receive the heaviest bombardment by the high energy ions at the sputtering target 804 when the target is in the sputtering device. In this manner, the inner and outer diameters of the toroidal portion 812 may be selected based on known properties of the magnetic field, gas, and target material being employed in the sputtering. The toroidal portion 812 is operable to allow for uniform erosion of material at the sputtering target 804. In this manner, the sputtering target is capable of greater than 65% consumption during its useful life.

As detailed supra, the various embodiments of the sputtering target disclosed herein are formed as a unitary body, although embodiments are contemplated in which the target is assembled as various parts. In the example embodiment, the sputtering target is formed using additive manufacturing although there is no limitation made herein to the method of manufacture. In one example, a binder jetting 3D printer can be used to fabricate the target from nanoscale particles or liquid state of the desired material. For brittle metals and ceramics, additive manufacturing is the technique of choice for manufacturing sputtering targets with the complex geometry disclosed herein. This geometry includes a planar substrate and toroidal portion expanding from the top surface of the plate. Brittle metals and ceramics are difficult to machine and the powder metallurgy route of obtaining complex shaped parts is more expensive than the additive manufacturing route. An example of fabricating complex shape from brittle metals using additive manufacturing is presented in the article titled "A facile method for producing porous parts with complex geometries from ferromagnetic Ni—Mn—Ga shape memory alloys", by M. P. Caputo et al. in Materials Letters, Aug. 1, 2017 at pgs 87-89.

Also, there is no limitation made herein to the material from which the sputtering target is formed. In one embodiment, the target can be formed from a metal, a metal alloy or an oxide. In one example, the target is formed from a ferromagnetic shape memory alloy (FSMA). Example FSMAs can include NiMnGa, NiMnSnAl, CoNiAl, CoNiGa, NiFeGa. NiMnIn, NiMnGaCoCuFe, NiCoMnSb, FeMnGa, FeMnCr, FePd-based, and FePt-based alloys. In another example, the target can be formed form copper. In yet another example, the target can be formed from an iron alloy and, more specifically, a stainless steel, and more specifically, a grade 314 steel.

In operation, the sputtering target disclosed herein is operative to receive the heaviest bombardment by the high energy ions of the magnetic field at the toroidal portion when the sputtering is instituted. When placed in a sputtering device, the target initially receives the magnetic field at the toroidal portion. By receiving the bombardment of ions at the toroidal portion, the target is operative to erode more evenly or uniformly toward the plate. This reduces waste of the target material and extends the useful life of the target. After the toroidal portion is worn down or is eroded by constant bombardment of fast-moving ions, the plate receives the magnetic field until the target is used or discarded.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A method for sputtering the sputtering target, wherein the sputtering target comprises:
   a planar substrate plate; and
   a toroidal portion extending from a top surface of the plate; wherein the toroidal portion reduces non-uniform erosion against the plate during a sputtering process;
   and wherein the method comprises:
   initially receiving a magnetic field at the toroidal portion, wherein the toroidal portion reduces non-uniform erosion against the plate; and
   after wearing down the toroidal portion by bombardment, receiving the magnetic field at the planar substrate plate.

* * * * *